United States Patent
Honda et al.

(10) Patent No.: US 10,224,311 B2
(45) Date of Patent: Mar. 5, 2019

(54) SEMICONDUCTOR ADHESIVE, AND SEMICONDUCTOR DEVICE AND METHOD FOR MANUFACTURING SAME

(71) Applicant: HITACHI CHEMICAL COMPANY, LTD., Tokyo (JP)

(72) Inventors: Kazutaka Honda, Tokyo (JP); Akira Nagai, Tokyo (JP); Makoto Satou, Tokyo (JP); Koichi Chabana, Tokyo (JP); Keishi Ono, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/532,898

(22) PCT Filed: Dec. 3, 2015

(86) PCT No.: PCT/JP2015/084069
§ 371 (c)(1),
(2) Date: Jun. 2, 2017

(87) PCT Pub. No.: WO2016/088859
PCT Pub. Date: Jun. 9, 2016

(65) Prior Publication Data
US 2017/0345797 A1  Nov. 30, 2017

(30) Foreign Application Priority Data

Dec. 5, 2014 (JP) .................................. 2014-247277
Dec. 5, 2014 (JP) .................................. 2014-247278

(51) Int. Cl.
*H01L 21/02* (2006.01)
*H01L 23/00* (2006.01)
(Continued)

(52) U.S. Cl.
CPC ............ *H01L 25/0657* (2013.01); *C09D 4/06* (2013.01); *C09J 201/00* (2013.01); *H01L 23/29* (2013.01);
(Continued)

(58) Field of Classification Search
CPC ................. H01L 25/0657; H01L 24/29; H01L 2225/06513; H01L 2225/0651;
(Continued)

(56) References Cited

U.S. PATENT DOCUMENTS 3,458,477 A * 7/1969 Zech .................... C08G 63/676
525/502
5,180,757 A * 1/1993 Lucey .................... C08F 290/08
522/76
(Continued)

FOREIGN PATENT DOCUMENTS

JP        05299535 A  * 11/1993 ............. H01L 23/28
JP     2008-294382      12/2008
(Continued)

OTHER PUBLICATIONS

International Search Report of Appln. No. PCT/JP2015/084069 dated Mar. 1, 2016 in English.
(Continued)

*Primary Examiner* — Caridad Everhart
(74) *Attorney, Agent, or Firm* — Fitch, Even, Tabin & Flannery LLP

(57) ABSTRACT

A semiconductor adhesive used for sealing connection portions of a semiconductor device, wherein: in the semiconductor device, the connection portion of a semiconductor chip and the connection portion of a wiring circuit substrate are electrically connected to each other or the connection portions of a plurality of semiconductor chips are electrically connected to each other; the semiconductor adhesive
(Continued)

comprises a (meth)acrylic compound and a curing agent; and when the semiconductor adhesive is kept at 200° C. for 5 seconds, a curing reaction rate thereof is 80% or more.

20 Claims, 4 Drawing Sheets

(51) Int. Cl.
- *H01L 25/065* (2006.01)
- *C09J 201/00* (2006.01)
- *H01L 23/29* (2006.01)
- *H01L 23/31* (2006.01)
- *H01L 25/07* (2006.01)
- *H01L 25/18* (2006.01)
- *C09D 4/06* (2006.01)

(52) U.S. Cl.
CPC .............. *H01L 23/31* (2013.01); *H01L 24/29* (2013.01); *H01L 25/065* (2013.01); *H01L 25/07* (2013.01); *H01L 25/18* (2013.01); *H01L 2225/0651* (2013.01); *H01L 2225/06513* (2013.01); *H01L 2225/06541* (2013.01); *H01L 2924/0002* (2013.01)

(58) Field of Classification Search
CPC ........... H01L 2225/06541; H01L 33/56; H01L 24/27; H01L 2933/0033; H01L 2924/0002; H01L 2924/00

See application file for complete search history.

(56) References Cited

U.S. PATENT DOCUMENTS

| 6,255,367 B1* | 7/2001 | Bitler | C08G 59/18 523/436 |
| 2004/0110857 A1* | 6/2004 | Kanai | C08G 2/10 522/100 |
| 2008/0012124 A1* | 1/2008 | Stapleton | C08K 5/43 257/713 |

FOREIGN PATENT DOCUMENTS

| JP | 2011-256391 | 12/2011 |
| WO | 2007/148724 | 12/2007 |

OTHER PUBLICATIONS

International Preliminary Report on Patentability of WO Appln. No. PCT/JP2015/084069 dated Jun. 15, 2017 in English.

* cited by examiner (a)

(b)

(a)

(b)

SEMICONDUCTOR ADHESIVE, AND SEMICONDUCTOR DEVICE AND METHOD FOR MANUFACTURING SAME

TECHNICAL FIELD

The present invention relates to a semiconductor adhesive, and a semiconductor device and a method for manufacturing the same.

BACKGROUND ART

To connect a semiconductor chip to a substrate in the related art, a wire bonding method using metal thin lines such as gold wires has been widely used. To meet requirements for e.g. higher functions, larger scale integration, and higher speed of semiconductor devices, a flip chip connection method (FC connection method) has been becoming popular, in which a conductive projection called a bump is formed on a semiconductor chip or a substrate to directly connect the semiconductor chip to the substrate.

A method for performing metal joining using solder, tin, gold, silver, copper and the like, a method for applying supersonic vibration to perform metal joining, and a method for causing the contraction force of a resin to hold mechanical contact, and the like, have been known as the flip chip connection method. From the viewpoint of the reliability of a connection portion, a method for performing metal joining using solder, tin, gold, silver, copper and the like is common.

Examples of the flip chip connection method also include a type of COB (Chip On Board) connection method frequently used in BGA (Ball Grid Array), CSP (Chip Size Package) and the like in order to provide connection between the semiconductor chip and the substrate. The flip chip connection method is also widely used in a type of COC (Chip On Chip) connection method in which bumps or wires are formed on semiconductor chips to connect the semiconductor chips (see Patent Literature 1, for example).

Packages for which there is great demand for further reductions in size and thickness or higher functions increasingly use chip-stack type package and POP (Package On Package) using the above-mentioned connection method laminated or multi-staged each other; TSV (Through-Silicon Via); and the like. These techniques are heavily used since three-dimensional arrangement can be performed rather than planar arrangement, which can attain a smaller package, are effective in an improvement in performance of semiconductors and reductions in noise, a mounting area and energy consumption, and receive attention as a semiconductor wiring technique of the next generation.

CITATION LIST

Patent Literature

Patent Literature 1: Japanese Unexamined Patent Publication No. 2008-294382

SUMMARY OF INVENTION

Technical Problem

In a flip chip package, in recent years, higher functions and larger scale integration further progress, but a pitch between wires becomes narrower as the higher functions and the larger scale integration, which is apt to cause deterioration in connection reliability.

In recent years, from the viewpoint of improving productivity, the shortening of a press bonding time when a flip chip package is assembled is required. In this case, if a semiconductor adhesive is not sufficiently cured during press bonding, a connection portion cannot be sufficiently protected, which causes failed connection when a pressure during press bonding is released. Furthermore, if a semiconductor adhesive is not sufficiently cured in a temperature range lower than a solder melting temperature during press bonding when solder is used for a connection portion, the scattering or flowage of solder occurs when a temperature during press bonding reaches the solder melting temperature, which causes failed connection. Therefore, excellent connection reliability is required in order to suppress these failed connections.

Then, it is an object of the present invention to provide a semiconductor adhesive having excellent connection reliability even if a press bonding time is a short time. It is another object of the present invention to provide a method for manufacturing a semiconductor device having excellent connection reliability even if a press bonding time is a short time. It is still another object of the present invention to provide a semiconductor device obtained by the method for manufacturing a semiconductor device.

Solution to Problem

The semiconductor adhesive of the present invention is a semiconductor adhesive used for sealing connection portions of a semiconductor device, wherein: in the semiconductor device, the connection portion of a semiconductor chip and the connection portion of a wiring circuit substrate are electrically connected to each other or the connection portions of a plurality of semiconductor chips are electrically connected to each other; the semiconductor adhesive comprises a (meth)acrylic compound and a curing agent; and when the semiconductor adhesive is kept at 200° C. for 5 seconds, a curing reaction rate thereof is 80% or more.

The semiconductor adhesive of the present invention has excellent connection reliability even if a press bonding time is a short time. The semiconductor adhesive of the present invention allows the press bonding time to be shortened, which can provide an improvement in productivity. The semiconductor adhesive of the present invention can easily apply higher function and larger scale integration to a flip chip package.

When a conventional semiconductor adhesive is used for high-temperature press bonding in a state where the semiconductor adhesive is not sufficiently cured, voids may occur. On the other hand, since the semiconductor adhesive of the present invention can be sufficiently cured in a short time, the occurrence of the voids can be easily suppressed.

In recent years, gold and the like which is less likely to corrode is gradually transferred to solder, copper and the like as a metal for the connection portion for the purpose of a cost reduction. Furthermore, also for a surface treatment of a wire and a bump, gold and the like which is less likely to corrode is gradually transferred to solder, copper, OSP (Organic Solderability Preservative) treatments and the like for the purpose of a cost reduction. Since such a cost reduction progresses in addition to a narrower pitch and an increasing number of pins in the flip chip package, a metal which is apt to corrode to cause deterioration in insulation properties tends to be used, which is apt to cause deterioration in insulation reliability. On the other hand, the semiconductor adhesive of the present invention can suppress the deterioration in insulation reliability.

It is preferable that the semiconductor adhesive further comprises a polymer component having the weight average molecular weight of 10000 or more. It is preferable that, in the semiconductor adhesive, the weight average molecular weight of the polymer component is 30000 or more, and the glass transition temperature of the polymer component is 100° C. or lower.

The semiconductor adhesive may be in a film form.

It is preferable for the (meth)acrylic compound to be a solid at 25° C.

It is preferable for the curing agent to be a thermal radical generator. It is preferable for the curing agent to be a peroxide.

A first embodiment of a method for manufacturing a semiconductor device of the present invention uses the semiconductor adhesive of the present invention. Such a manufacturing method can manufacture many semiconductor devices having excellent connection reliability in a short time.

A first embodiment of the semiconductor device of the present invention is obtained by the method for manufacturing a semiconductor device of the first embodiment.

A second embodiment of the method for manufacturing a semiconductor device of the present invention is a method for manufacturing a semiconductor device, wherein: the method comprises the step of connecting a semiconductor chip and a wiring circuit substrate to each other with a semiconductor adhesive sandwiched therebetween and electrically connecting a connection portion of the semiconductor chip and a connection portion of the wiring circuit substrate to each other to obtain the semiconductor device, or the step of connecting a plurality of semiconductor chips to each other with a semiconductor adhesive sandwiched therebetween and electrically connecting connection portions of the plurality of semiconductor chips to each other to obtain the semiconductor device; the semiconductor adhesive comprises a (meth)acrylic compound and a curing agent; and when the semiconductor adhesive is kept at 200° C. for 5 seconds, the curing reaction rate thereof is 80% or more.

The method for manufacturing a semiconductor device of the second embodiment has excellent connection reliability even if a press bonding time is a short time. Such a manufacturing method can manufacture many semiconductor devices having excellent connection reliability in a short time. The method for manufacturing a semiconductor device of the second embodiment can easily apply higher function and larger scale integration to a flip chip package.

When high-temperature press bonding is performed in a conventional method for manufacturing a semiconductor device in a state where a semiconductor adhesive is not sufficiently cured, voids may occur. On the other hand, the method for manufacturing a semiconductor device of the second embodiment allows the semiconductor adhesive to be sufficiently cure in a short time, which can easily suppress the occurrence of the voids.

In recent years, gold and the like which is less likely to corrode is gradually transferred to solder, copper and the like as a metal for the connection portion for the purpose of a cost reduction. Furthermore, also for a surface treatment of a wire and a bump, gold and the like which is less likely to corrode is gradually transferred to solder, copper, OSP (Organic Solderability Preservative) treatments and the like for the purpose of a cost reduction. Since such a cost reduction progresses in addition to a narrower pitch and an increasing number of pins in the flip chip package, a metal which is apt to corrode to cause deterioration in insulation properties tends to be used, which is apt to cause deterioration in insulation reliability. On the other hand, the method for manufacturing a semiconductor device of the second embodiment can suppress the deterioration in insulation reliability.

It is preferable that, in the method for manufacturing a semiconductor device of the second embodiment, the semiconductor adhesive further comprises a polymer component having the weight average molecular weight of 10000 or more. It is preferable that, in the semiconductor adhesive, the weight average molecular weight of the polymer component is 30000 or more, and the glass transition temperature of the polymer component is 100° C. or lower. The semiconductor adhesive may be in a film form.

In the method for manufacturing a semiconductor device of the second embodiment, the connection portions may be connected to each other by metal joining.

In the method for manufacturing a semiconductor device of the second embodiment, it is preferable for the (meth)acrylic compound to be a solid at 25° C.

In the method for manufacturing a semiconductor device of the second embodiment, it is preferable for the curing agent to be a thermal radical generator. It is preferable for the curing agent to be a peroxide.

A second embodiment of the semiconductor device of the present invention is obtained by the method for manufacturing a semiconductor device of the second embodiment.

Advantageous Effects of Invention

The present invention can provide a semiconductor adhesive having excellent connection reliability even if a press bonding time is a short time. The present invention can provide a semiconductor device and a method for manufacturing the same using such a semiconductor adhesive. The present invention can provide a method for manufacturing a semiconductor device having excellent connection reliability even if a press bonding time is a short time, and a semiconductor device obtained by the manufacturing method. The present invention can provide the application of a semiconductor adhesive for sealing connection portions of a semiconductor device, wherein in the semiconductor device, the connection portion of the semiconductor chip and the connection portion of the wiring circuit substrate are electrically connected to each other or the connection portions of the plurality of semiconductor chips are electrically connected to each other.

DESCRIPTION OF EMBODIMENTS

Figure 1:
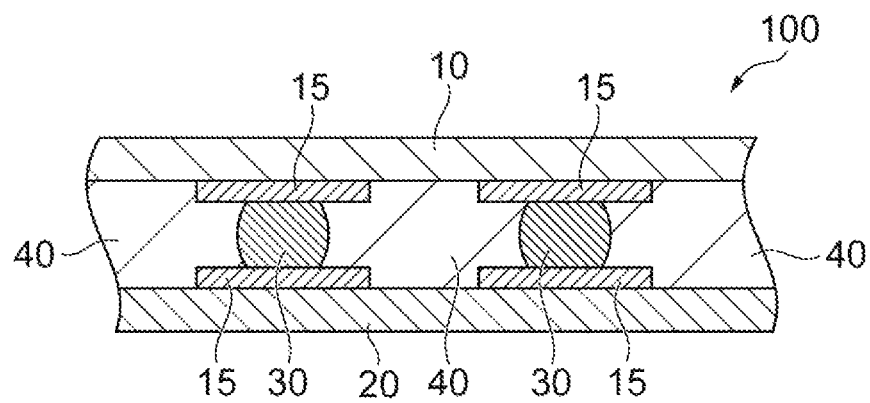
FIG. 1 is a schematic sectional view showing a semiconductor device of one embodiment of the present invention.
Figure 1:
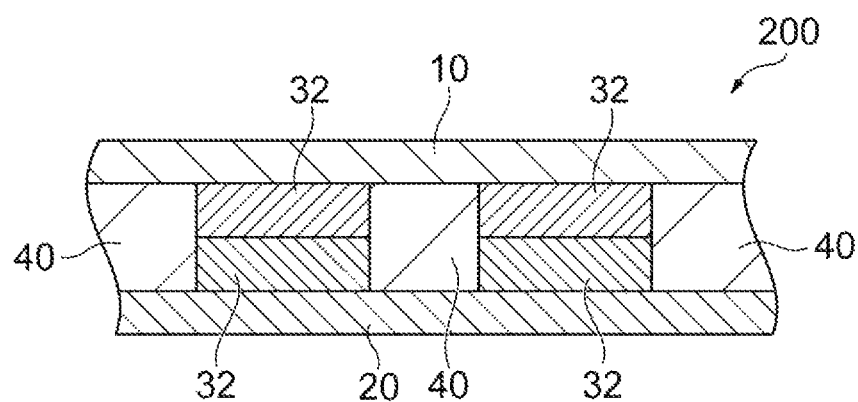

Hereinafter, the embodiments of the present invention will be described in detail. Herein, the expression "(meth)acrylic" refers to acrylic or methacrylic corresponding thereto. The same applies also to similar expressions such as "(meth)acrylate". In addition, in the case where a plurality of substances corresponding to each of the components is present in a composition, unless otherwise specified, the content of each of the components in the composition means the total amount of the plurality of substances present in the composition. In referring to the expression "A or B", any one of A and B may be contained or both A and B may be contained.

<Semiconductor Adhesive>

The semiconductor adhesive of the present embodiment can be used as a semiconductor sealing adhesive used for sealing connection portions of a semiconductor device, wherein in the semiconductor device, the connection portion of a semiconductor chip and the connection portion of a wiring circuit substrate are electrically connected to each other or the connection portions of a plurality of semiconductor chips are electrically connected to each other. The semiconductor adhesive of the present embodiment comprises (a) (meth)acrylic compound and (b) curing agent. When the semiconductor adhesive of the present embodiment is kept at 200° C. for 5 seconds, the curing reaction rate thereof is 80% or more.

(Component (a): (Meth)Acrylic Compound)

The component (a) is not particularly limited as long as it is a compound having one or more (meth)acrylic groups ((meth)acryloyl groups) in a molecule, and for example, a (meth)acrylic compound containing a skeleton of bisphenol A, bisphenol F, naphthalene, phenol novolak, cresol novolak, phenol aralkyl, biphenyl, triphenylmethane, dicyclopentadiene, fluorene, adamantane, or isocyanuric acid; and a variety of polyfunctional (meth)acrylic compounds (excluding the (meth)acrylic compound containing the above skeleton), and the like, can be used. Examples of the polyfunctional (meth)acrylic compound include pentaerythritol tri(meth)acrylate, dipentaerythritol penta(meth)acrylate, and trimethylolpropane di(meth)acrylate. It is preferable for the component (a) to be (meth)acrylates containing bisphenol A skeleton, bisphenol F skeleton, naphthalene skeleton, fluorene skeleton, adamantane skeleton, or isocyanuric acid skeleton from the viewpoint of excellent heat resistance. The components (a) can be used singly or in combinations of two or more.

It is preferable for the content of the component (a) to be 10% by mass or more, and more preferable to be 15% by mass or more based on the total amount (total solid content) of the semiconductor adhesive from the viewpoint of suppressing a decrease in a curing component to be likely to sufficiently control the flowage of a resin after being cured. It is preferable for the content of the component (a) to be 50% by mass or less, and more preferable to be 40% by mass or less based on the total amount (total solid content) of the semiconductor adhesive from the viewpoints of suppressing the excessive curing of a cured material and of tending to be likely to suppress an increase in the warpage of a package. From these viewpoints, it is preferable for the content of the component (a) to be 10 to 50% by mass, and more preferable to be 15 to 40% by mass based on the total amount (total solid content) of the semiconductor adhesive.

It is preferable for the component (a) to be a solid at room temperature (25° C.). Voids are less likely to occur in the solid as compared with a liquid, and the viscosity (tackiness) of the semiconductor adhesive before being cured (B stage) is small, which provides excellent handling properties. Examples of the component (a) which is a solid at room temperature (25° C.) include (meth)acrylates containing bisphenol A skeleton, fluorene skeleton, adamantane skeleton, or isocyanuric acid skeleton.

It is preferable for the number of functional groups in the (meth)acrylic group in the component (a) to be 3 or less. Since an increase in the number of functional groups is suppressed when the number of functional groups is 3 or less, which is likely to make sufficient curing progress in a short time, a decrease in the curing reaction rate is likely to be suppressed (when the number of functional groups is large, a curing network progresses at a rapid rate, so that unreacted groups may remain).

It is preferable for the average molecular weight of the component (a) to be less than 10000, and more preferable to be 5000 or less. The smaller molecular weight is likely to be reacted, and has a high reaction rate.

(Component (b): Curing Agent)

The component (b) is not particularly limited as long as it functions as the curing agent for the component (a). It is preferable for curing system to be a radical polymerization. It is preferable for the component (b) to be a radical generator. Examples of the radical generator include a thermal radical generator (radical generator induced by heat) and a photo-radical generator (radical generator induced by light). It is preferable for the component (b) to be a thermal radical generator from the viewpoint of excellent handling properties. The components (b) can be used singly or in combinations of two or more.

Examples of the thermal radical generator include an azo compound and a peroxide (organic peroxide and the like). It is preferable for the thermal radical generator to be a peroxide, and more preferable to be an organic peroxide from the viewpoints of excellent handling properties and preservation stability. Examples of the organic peroxide include ketone peroxide, peroxy ketal, hydroperoxide, dialkyl peroxide, diacyl peroxide, peroxy dicarbonate, and peroxy ester. It is preferable for the organic peroxide to be at least one selected from the group consisting of hydroperoxide, dialkyl peroxide, and peroxy ester from the viewpoint of excellent preservation stability. Furthermore, it is preferable for the organic peroxide to be at least one selected from the group consisting of hydroperoxide and dialkyl peroxide from the viewpoint of excellent heat resistance. Examples of the dialkyl peroxide include dicumyl peroxide and di-tert-butyl peroxide.

It is preferable for the content of the component (b) to be 0.5 parts by mass or more, and more preferable to be 1 part by mass or more with respect to 100 parts by mass of the component (a) from the viewpoint that sufficient curing is likely to progress. It is preferable for the content of the component (b) to be 10 parts by mass or less, and more preferable to be 5 parts by mass or less with respect to 100 parts by mass of the component (a) from the viewpoints that an increase in the number of reactive sites caused by rapid curing progressing is suppressed to shorten a molecule chain, and the remaining of unreacted groups is suppressed to tend to be likely to suppress deterioration in reliability. From these viewpoints, it is preferable for the content of the component (b) to be 0.5 to 10 parts by mass, and more preferable to be 1 to 5 parts by mass with respect to 100 parts by mass of the component (a).

(Component (c): Polymer Component)

The semiconductor adhesive of the present embodiment can further comprise a polymer component (excluding a compound corresponding to the component (a) and a compound corresponding to a component (d)). Examples of the component (c) include an epoxy resin, a phenoxy resin, a polyimide resin, a polyamide resin, a polycarbodiimide resin, a cyanate ester resin, a (meth)acrylic resin, a polyester resin, a polyethylene resin, a polyethersulfone resin, a polyether imide resin, a polyvinyl acetal resin, an urethane resin, and acrylic rubber; among these, from the viewpoints of excellent heat resistance and film forming properties, at least one selected from the group consisting of an epoxy resin, a phenoxy resin, a polyimide resin, a (meth)acrylic resin, acrylic rubber, a cyanate ester resin, and a polycarbodiimide resin is preferable, and at least one selected from the group consisting of an epoxy resin, a phenoxy resin, a polyimide resin, a (meth)acrylic resin, and acrylic rubber is more preferable. The components (c) can also be used singly or in combinations of two or more as a mixture or a copolymer.

The mass ratio between the component (c) and the component (a) is not particularly limited, but it is preferable to be within the following range. It is preferable for the content of the component (a) to be 0.01 parts by mass or more, more preferable to be 0.05 parts by mass or more, and still more preferable to be 0.1 parts by mass or more with respect to 1 part by mass of the component (c) from the viewpoints of suppressing deterioration in curability and of being likely to suppress a decrease in adhesive strength. It is preferable for the content of the component (a) to be 10 parts by mass or less, and more preferable to be 5 parts by mass or less with respect to 1 part by mass of the component (c) from the viewpoint of being likely to suppress deterioration in film forming properties. From these viewpoints, it is preferable for the content of the component (a) to be 0.01 to 10 parts by mass, more preferable to be 0.05 to 5 parts by mass, and still more preferable to be 0.1 to 5 parts by mass with respect to 1 part by mass of the component (c).

It is preferable for the glass transition temperature (Tg) of the component (c) to be 120° C. or lower, more preferable to be 100° C. or lower, and still more preferable to be 85° C. or lower from the viewpoint of excellent applying properties of the semiconductor adhesive to the substrate or the chip. In these ranges, the semiconductor adhesive can easily embed convexoconcaves such as bumps formed on the semiconductor chip and electrodes or circuit patterns formed on the substrate (the start of a curing reaction is likely to be suppressed), and it tends to be likely to suppress the occurrence of voids caused by remaining air bubbles. The above Tg is obtained by measurement using DSC (manufactured by PerkinElmer, Inc., trade name: DSC-7 type) under conditions with a sample amount of 10 mg, a temperature raising rate of 10° C./min, and a measurement atmosphere of air.

It is preferable for the weight average molecular weight of the component (c) to be 10000 or more in terms of polystyrene; more preferable to be 30000 or more, still more preferable to be 40000 or more, and particularly preferable to be 50000 or more in order to independently exhibit good film forming properties. When the weight average molecular weight is 10000 or more, deterioration in the film forming properties tends to be likely to be suppressed. Herein, in the present specification, the weight average molecular weight means a weight average molecular weight obtained by measurement with the conversion of polystyrene using high-performance liquid chromatography (manufactured by Shimadzu Corporation, trade name: C-R4A). The following conditions can be used for the measurement, for example.

Detector: LV4000 UV Detector (manufactured by Hitachi, Ltd., trade name)

Pump: L6000 Pump (manufactured by Hitachi, Ltd., trade name)

Column: Gelpack GL-S300MDT-5 (two columns in total) (manufactured by Hitachi Chemical Co., Ltd., trade name)

Eluent: THF/DMF=1/1 (volume ratio)+LiBr (0.03 mol/L)+$H_3PO_4$ (0.06 mol/L)

Flow rate: 1 mL/min (Component (d): Filler)

The semiconductor adhesive of the present embodiment may further comprise a filler in order to control the viscosity or the physical properties of the cured material, and in order to further suppress the occurrence of the voids when the semiconductor chip and the substrate are connected or a moisture absorption rate. Examples of the component (d) include an inorganic filler (inorganic particle) and a resin filler (resin particle). Examples of the inorganic filler include insulating inorganic fillers made of glass, silica, alumina, titanium oxide, carbon black, mica, boron nitride and the like; among these, at least one selected from the group consisting of silica, alumina, titanium oxide, and boron nitride is preferable; and at least one selected from the group consisting of silica, alumina, and boron nitride is more preferable. The insulating inorganic filler may be a whisker. Examples of the whisker include aluminum borate, aluminum titanate, zinc oxide, silicic acid calcium, magnesium sulfate, and boron nitride. Examples of the resin filler include polyurethane and polyimide. Since the resin filler can apply flexibility at higher temperatures such as 260° C. than those in the inorganic filler, the resin filler is suitable for an improvement in reflow resistance, and since the resin filler can apply flexibility, the resin filler also has an effect of providing an improvement in film forming properties. The components (d) can be used singly or in combinations of two or more. The shape, the particle diameter, and the content of the component (d) are not particularly limited.

From the viewpoint of more excellent insulation reliability, it is preferable for the component (d) to have insulation properties. It is preferable that the semiconductor adhesive of the present embodiment does not comprise a conductive metal filler (metal particle) such as a silver filler or a solder filler.

The physical properties of the component (d) may be properly adjusted by a surface treatment. It is preferable for the component (d) to be a filler subjected to a surface treatment from the viewpoint of improving dispersibility or adhesive strength. Examples of a surface treatment agent include glycidyl-based (epoxy-based), amine-based, phenyl-based, phenylamino-based, (meth)acrylic-based, and vinyl-based compounds.

It is preferable for the surface treatment to be a silane treatment using a silane compound such as an epoxysilane-based, aminosilane-based, or acrylic silane-based compound from the ease of the surface treatment. From the viewpoints of excellent dispersibility, flowability, and adhesive strength, it is preferable for the surface treatment agent to be at least one selected from the group consisting of glycidyl-based compounds, phenylamino-based compounds, and (meth)acrylic-based compounds. From the viewpoint of excellent preservation stability, it is preferable for the surface treatment agent to be at least one selected from the group consisting of phenyl-based compounds and (meth)acrylic-based compounds.

It is preferable for the average particle diameter of the component (d) to be 1.5 μm or less from the viewpoint of preventing biting during flip chip connection, and more preferable to be 1.0 μm or less from the viewpoint of excellent visibility (transparency).

It is preferable for the content of the component (d) to be 30% by mass or more, and more preferable to be 40% by mass or more based on the total solid content of the semiconductor adhesive from the viewpoint of suppressing deterioration in heat dissipation properties and from the viewpoint of tending to be likely to suppress the occurrence of voids, an increase in the moisture absorption rate, and the like. It is preferable for the content of the component (d) to be 90% by mass or less, and more preferable to be 80% by mass or less based on the total solid content of the semiconductor adhesive from the viewpoints of being likely to suppress deterioration in the flowability of the semiconductor adhesive caused by high viscosity, and to suppress the occurrence of the biting (trapping) of the filler to the connection portion, and tending to be likely to suppress deterioration in connection reliability. From these viewpoints, it is preferable for the content of the component (d) to be 30 to 90% by mass, and more preferable to be 40 to 80% by mass based on the total solid content of the semiconductor adhesive.

(Component (e): Fluxing Agent)

The semiconductor adhesive of the present embodiment can further comprise a fluxing agent (that is, a fluxing active agent exhibiting fluxing activity (activity for removing oxides or impurities)). Examples of the fluxing agent include nitrogen-containing compounds having unshared electron pairs (imidazoles, amines and the like), carboxylic acids, phenols, and alcohols. Organic acids (carboxylic acids such as 2-methyl glutaric acid, and the like) demonstrate fluxing activity strongly as compared with alcohols and the like, which provides a further improvement in connectivity.

The semiconductor adhesive of the present embodiment may further comprise an additive such as an ion trapper, an antioxidant, a silane coupling agent, a titanium coupling agent, or a leveling agent. These additives can be used singly or in combinations of two or more. The contents of these additives may be properly adjusted to demonstrate the effects of the respective additives.

When the semiconductor adhesive of the present embodiment is kept at 200° C. for 5 seconds, the curing reaction rate thereof is 80% or more, and it is preferable to be 90% or more. When the curing reaction rate at 200° C. (a temperature equal to or lower than a solder melting temperature)/5 seconds is less than 80%, solder scatters and flows during connection (at a temperature equal to or higher than a solder melting temperature), which causes deterioration in connection reliability. The curing reaction rate can be obtained by putting 10 mg of an uncured semiconductor adhesive into an aluminum pan, and thereafter performing measurement at a temperature raising rate of 20° C./min in a temperature range of 30 to 300° C. using DSC (manufactured by PerkinElmer, Inc., trade name: DSC-7 type).

When the semiconductor adhesive comprises an anionic polymerizable epoxy resin (particularly, an epoxy resin having a weight average molecular weight of 10000 or more), it is easy to adjust the curing reaction rate to 80% or more. It is preferable that the content of the epoxy resin is 20 parts by mass or less with respect to 80 parts by mass of the component (a), and it is more preferable that no epoxy resin is comprised.

The semiconductor adhesive of the present embodiment is applicable to press bonding at high temperatures of 200° C. or higher. Also, in a flip chip package which is melting a metal such as solder to form connection, more excellent curability is demonstrated.

It is preferable for the semiconductor adhesive of the present embodiment to be in a film form (semiconductor adhesive film) from the viewpoint of an improvement in productivity. A method for manufacturing the semiconductor adhesive film will be shown below.

First, a component (a), a component (b), and other components are added to an organic solvent, and are then dissolved or dispersed by stirring and mixing or by kneading, or the like, to prepare a resin varnish. Subsequently, the resin varnish is applied onto a base material film subjected to a releasing treatment using a knife coater, a roll coater, an applicator, a die coater, a comma coater and the like, and the organic solvent is then decreased by heating to form a semiconductor adhesive film on the base material film. A semiconductor adhesive film may be formed on a wafer by a method for applying a resin varnish onto the wafer and the like by spin coating to form a film, and thereafter drying a solvent before decreasing the organic solvent by heating.

The base material film is not particularly limited as long as it has heat resistance to endure a heating condition during volatilization of the organic solvent, and examples thereof include a polyester film (for example, a polyethylene terephthalate film), a polypropylene film, a polyimide film, a polyether imide film, a polyether naphthalate film, and a methylpentene film. The base material film is not limited to a single layer composed of one of these films, and may be a multi-layer film composed of two or more films.

As a condition when the organic solvent is volatized from the applied resin varnish, specifically, heating is preferably performed at 50 to 200° C. for 0.1 to 90 minutes. It is preferable to use the condition that the organic solvent is volatized to 1.5% by mass or less as long as the volatilization of the organic solvent does not affect voids after mounting or viscosity adjustment.

<Semiconductor Device>

A semiconductor device of the present embodiment will be described. The semiconductor device of the present embodiment can be obtained by a method for manufacturing a semiconductor device of the present embodiment. The semiconductor device of the present embodiment can be manufactured using the semiconductor adhesive of the present embodiment. A connection portion of the semiconductor device of the present embodiment may be any of metal joining between a bump and a wire and metal joining between bumps. The semiconductor device of the present embodiment can use, for example, flip chip connection providing electric connection via the semiconductor adhesive.

A first aspect of the semiconductor device of the present embodiment comprises a semiconductor chip and a substrate (wiring circuit substrate) facing each other, connection portions (wires, bumps, and the like) disposed on the surfaces facing each other of the semiconductor chip and the substrate, and a sealing member disposed between the semiconductor chip and the substrate, and the sealing member seals the connection portions, and contains the semiconductor adhesive of the present embodiment or its cured material. The semiconductor device of the first embodiment may further comprise bumps for connecting the wire of the semiconductor chip and the wire of the substrate to each other when the wires are disposed on the surfaces facing each other of the semiconductor chip and the substrate.

A second aspect of the semiconductor device of the present embodiment comprises a first semiconductor chip and a second semiconductor chip facing each other, connection portions (wires, bumps, and the like) disposed on the surfaces facing each other of the first semiconductor chip and the second semiconductor chip, and a sealing member disposed between the first semiconductor chip and the second semiconductor chip, and the sealing member seals the connection portions, and contains the semiconductor adhesive of the present embodiment or its cured material. The semiconductor device of the second embodiment may further comprise bumps for connecting the wire of the first semiconductor chip and the wire of the second semiconductor chip to each other when the wires are disposed on the surfaces facing each other of the first semiconductor chip and the second semiconductor chip.

FIG. 1 is a schematic sectional view showing a semiconductor device of an embodiment (a COB type connection of a semiconductor chip and a substrate). As shown in FIG. 1(a), a semiconductor device 100 comprises a semiconductor chip 10 and a substrate (circuit wiring substrate) 20 facing each other, wires 15 disposed on the surfaces facing each other of the semiconductor chip 10 and the substrate 20, connection bumps 30 for connecting the wires 15 of the semiconductor chip 10 and the substrate 20 to each other, and a semiconductor adhesive 40 with which a gap between the semiconductor chip 10 and the substrate 20 is filled completely. The semiconductor chip 10 and the substrate 20 are flip chip connected through the wires 15 and the connection bumps 30. The wires 15 and the connection bumps 30 are sealed with the semiconductor adhesive 40 to be shielded against an external environment.

As shown in FIG. 1(b), a semiconductor device 200 comprises a semiconductor chip 10 and a substrate 20 facing each other, bumps 32 disposed on the surfaces facing each other of the semiconductor chip 10 and the substrate 20, and a semiconductor adhesive 40 with which a gap between the semiconductor chip 10 and the substrate 20 is filled completely. The semiconductor chip 10 and the substrate 20 are flip chip connected through connection of the bumps 32 facing each other. The bumps 32 are sealed with the semiconductor adhesive 40 to be shielded against an external environment.

Figure 2:
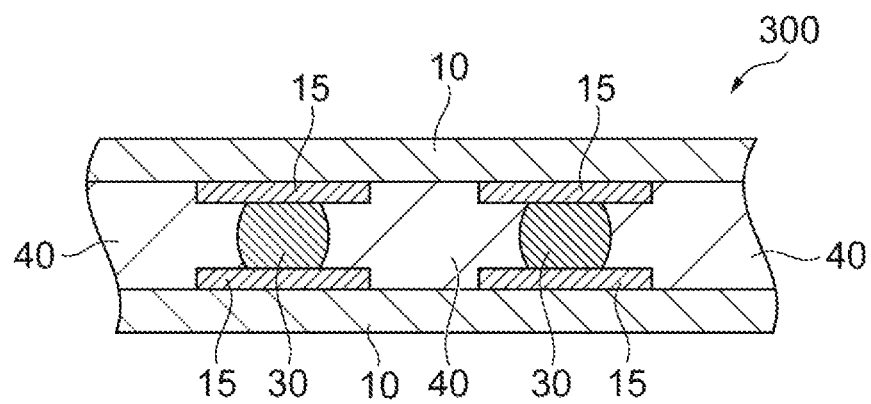
FIG. 2 is a schematic sectional view showing a semiconductor device of another embodiment of the present invention.
Figure 2:
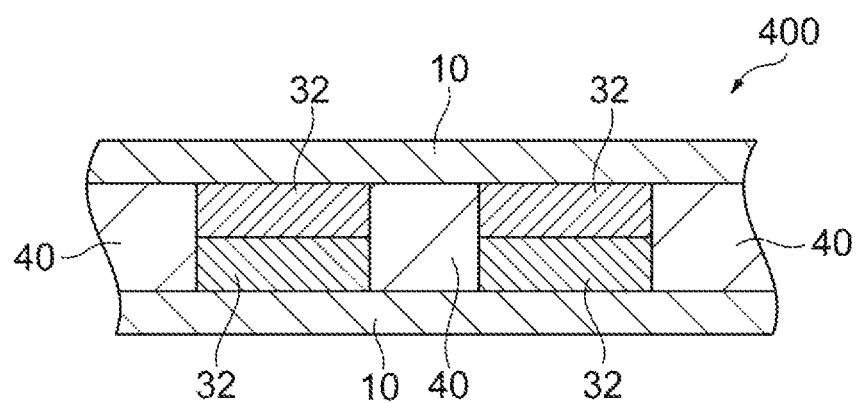

FIG. 2 is a schematic sectional view showing a semiconductor device of another embodiment (a COC type connection of semiconductor chips). As shown in FIG. 2(a), a semiconductor device 300 is similar to the semiconductor device 100 except that two semiconductor chips 10 are flip chip connected to each other through the wires 15 and the connection bumps 30. As shown in FIG. 2(b), a semiconductor device 400 is similar to the semiconductor device 200 except that two semiconductor chips 10 are flip chip connected to each other through the bumps 32.

The semiconductor chip 10 is not particularly limited, and various semiconductors such as an element semiconductor composed of one identical element such as silicon and germanium; and a compound semiconductor including gallium arsenic and indium phosphorus can be used.

The substrate 20 is not particularly limited as long as it is a wiring circuit substrate; it is possible to use a circuit substrate having wires (wire pattern) formed on the surface of an insulating substrate including glass epoxy, polyimide, polyester, ceramic, an epoxy resin, bismaleimide triazine, polyimide or the like as the main component by removing unnecessary portions of a metal layer by etching; a circuit substrate having wires (wire pattern) formed on the surface of the insulating substrate by metal plating and the like; and a circuit substrate having wires (wire pattern) formed by printing a conductive substance on the surface of the insulating substrate, and the like.

The connection portions such as the wires 15 and the bumps 32 contain gold, silver, copper, solder (its main component is tin-silver, tin-lead, tin-bismuth, and tin-copper, for example), nickel, tin, lead and the like as the main component, and may contain a plurality of metals.

A metal layer containing gold, silver, copper, solder (its main component is tin-silver, tin-lead, tin-bismuth, and tin-copper, for example), tin, nickel, and the like, as the main component may be formed on the surfaces of the wires (wire pattern). The metal layer may be composed of a single component alone, or may be composed of a plurality of components. The metal layer may have a structure in which a plurality of metal layers are laminated. Copper and solder are generally used since these are inexpensive.

For a material of conductive projections called bumps, gold, silver, copper, solder (its main component is tin-silver, tin-lead, tin-bismuth, and tin-copper, for example), tin, nickel, and the like are used as the main component; and it may be composed of a single component alone, or may be composed of a plurality of components.

It may be formed to have a structure in which these metals are laminated. The bump may be formed on the semiconductor chip or the substrate. Copper and solder are generally used since these are inexpensive.

A semiconductor device (package) as shown in FIG. 1 or 2 may be laminated and electrically connected using gold, silver, copper, solder (its main component is tin-silver, tin-lead, tin-bismuth, and tin-copper, for example), tin, nickel, and the like. Copper and solder are preferable from the viewpoint of being generally used since these are inexpensive. For example, as seen in a TSV technique, semiconductor chips may be flip chip connected to or laminated each other with a semiconductor adhesive sandwiched therebetween, followed by forming a hole passing through the semiconductor chips, thereby achieving the connection to electrodes on a patterned surface.

Figure 3:
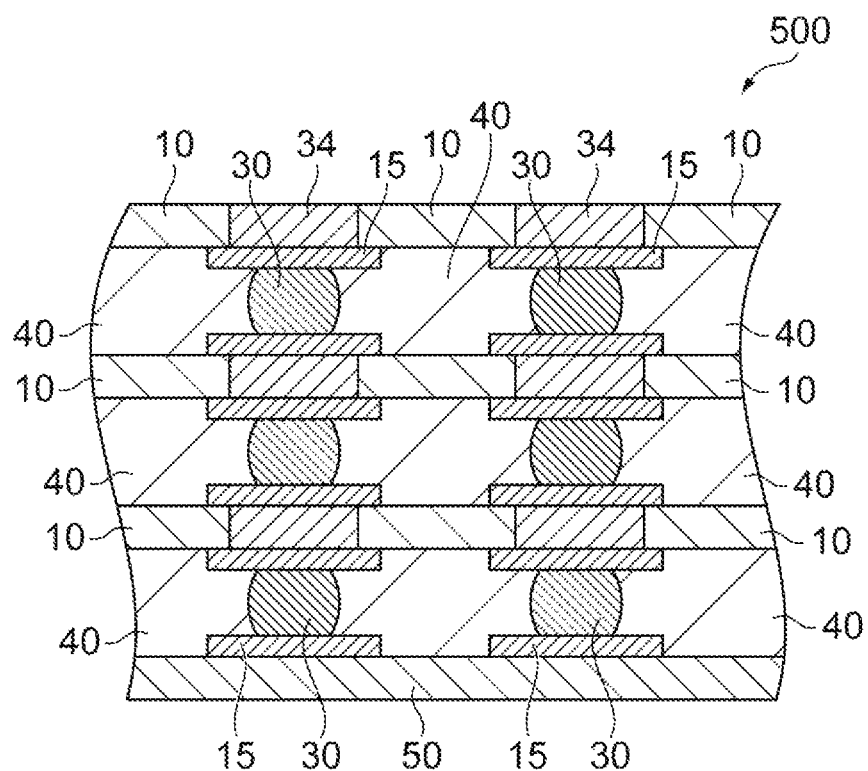
FIG. 3 is a schematic sectional view showing a semiconductor device of another embodiment of the present invention.

FIG. 3 is a schematic sectional view showing a semiconductor device of another embodiment (aspect of semiconductor chip lamination type (TSV)). In a semiconductor device 500 shown in FIG. 3, wires 15 formed on an interposer 50 are connected to wires 15 on the semiconductor chip 10 through connection bumps 30 to flip chip connect the semiconductor chip 10 to the interposer 50. The gap between the semiconductor chip 10 and the interposer 50 is completely filled with a semiconductor adhesive 40. The semiconductor chip 10 is repeatedly laminated on the surface of the semiconductor chip 10 on the side opposite to the interposer 50 through the wires 15, connection bumps 30, and the semiconductor adhesive 40. The wires 15 disposed on front patterned surface and rear patterned surface of the semiconductor chip 10 are connected to each other through penetrating electrodes 34 filled in holes penetrating through the inside of the semiconductor chip 10. Copper, aluminum and the like can be used as a material for the penetrating electrode 34.

Such a TSV technique allows acquisition of signals from the rear surface of the semiconductor chip, which is usually not used. Furthermore, the penetrating electrode 34 is vertically passed through the inside of the semiconductor chip 10, and therefore, the distance between the facing semiconductor chips 10 or the distance between the semiconductor chip 10 and the interposer 50 is reduced to allow flexible connection. The semiconductor adhesive of the present embodiment can be applied as a sealing material provided between the facing semiconductor chips 10 or between the semiconductor chip 10 and the interposer 50 in these TSV techniques.

In a bump forming method having great freedom, such as an area bump chip technique, the semiconductor chip can be directly mounted on a mother board without an interposer. The semiconductor adhesive of the present embodiment can also be applied in such direct mounting of the semiconductor chip on a mother board. The semiconductor adhesive of the present embodiment can be applied to seal a gap between two wiring circuit substrates when the two substrates are laminated.

<Method for Manufacturing Semiconductor Device>

A method for manufacturing a semiconductor device of the present embodiment can connect a semiconductor chip and a wiring circuit substrate to each other or connect a plurality of semiconductor chips to each other using the semiconductor adhesive of the present embodiment. For example, the method for manufacturing a semiconductor device of the present embodiment comprises the step of connecting a semiconductor chip and a wiring circuit substrate to each other with a semiconductor adhesive sandwiched therebetween and electrically connecting a connection portion of the semiconductor chip and a connection portion of the wiring circuit substrate to each other to obtain the semiconductor device, or the step of connecting a plurality of semiconductor chips to each other with a semiconductor adhesive sandwiched therebetween and electrically connecting connection portions of the plurality of semiconductor chips to each other to obtain the semiconductor device.

In the method for manufacturing a semiconductor device of the present embodiment, the connection portions can be connected to each other by metal joining. That is, the connection portion of the semiconductor chip and the connection portion of the wiring circuit substrate are connected to each other by metal joining, or the connection portions of the plurality of semiconductor chips are connected to each other by metal joining.

As an example of the method for manufacturing a semiconductor device of the present embodiment, a method for manufacturing a semiconductor device 600 shown in FIG. 4 will be described. In the semiconductor device 600, a substrate (glass epoxy substrate) 60 having wires (copper wires) 15 and a semiconductor chip 10 having wires (copper pillars, copper posts) 15 are connected to each other with a semiconductor adhesive 40 sandwiched therebetween. The wires 15 of the semiconductor chip 10 and the wires 15 of the substrate 60 are electrically connected by connection bumps (solder bumps) 30. A solder resist 70 is disposed except for the formation positions of the connection bumps 30 on the surface on which the wires 15 are formed in the substrate 60.

In the method for manufacturing the semiconductor device 600, first, a semiconductor adhesive (semiconductor adhesive film and the like) 40 is applied onto the substrate 60 having the solder resist 70 formed thereon. The semiconductor adhesive 40 can be applied by heat press, roll lamination, vacuum lamination, and the like. The applied area or the thickness of the semiconductor adhesive are properly set according to the size of the semiconductor chip 10 or the substrate 60, the height of the bump, and the like. The semiconductor adhesive 40 may be applied to the semiconductor chip 10, or the semiconductor adhesive 40 may be applied to a semiconductor wafer, and then singulated to the semiconductor chip 10 by dicing to produce the semiconductor chip 10 to which the semiconductor adhesive 40 is applied. After the semiconductor adhesive 40 is applied to the substrate 60 or the semiconductor chip 10, the connection bumps 30 on the wires 15 of the semiconductor chip 10 and the wires 15 of the substrate 60 are aligned with a connection apparatus such as a flip chip bonder. The semiconductor chip 10 and the substrate 60 are pressed against each other while being heated at a temperature equal to or higher than the melting point of the connection bump 30 (when solder is used in the connection portion, a temperature of 240° C. or higher is preferably applied to the solder portion) to connect the semiconductor chip 10 to the substrate 60 and fill and seal the gap between the semiconductor chip 10 and the substrate 60 with the semiconductor adhesive 40. A connection load depends on the number of bumps, but it is set in consideration of the absorption of a variation of the height of the bumps, or the control of the amount of deformation of the bumps. The connection time is preferably a shorter time from the viewpoint of an improvement in productivity. It is preferable that solder is fused and an oxide film or a surface impurity is removed, thereby forming metal joining in the connection portions.

The short connection time (press bonding time) means that a time (for example, a time when solder is used) for which a temperature of 240° C. or higher is applied to the connection portions during connection formation (main press bonding) is 10 seconds or less. It is preferable for the connection time to be 5 seconds or less, more preferable to be 4 seconds or less, still more preferable to be 3 seconds or less, and particularly preferable to be 2 seconds or less.

After alignment, the semiconductor chip may be temporarily fixed to the substrate, and be subjected to a heat treatment in a reflow furnace to fuse the solder bumps to connect the semiconductor chip to the substrate, thereby manufacturing the semiconductor device. In temporary fixing, formation of metal bonding is not dominantly required; and accordingly, it may be performed at a smaller load, a shorter time, or a lower temperature than in the above main press bonding, which provides merits such as an improvement in productivity and prevention of deterioration of the connection portions. After the semiconductor chip is connected to the substrate, a heat treatment may be performed in an oven and the like to cure the semiconductor adhesive. The heating temperature is a temperature at which the curing of the semiconductor sealing adhesive progresses, preferably a temperature at which the semiconductor sealing adhesive is completely cured. The heating temperature and the heating time may be properly set.

EXAMPLES

Hereinafter, the present invention will be described with reference to Examples, but the present invention is not limited thereto.

<Production of Film Adhesive>

Compounds used for producing a film adhesive will be shown below.

(a) (Meth)Acrylic Compound

Pentaerythritol triacrylate (manufactured by KYOEISHA CHEMICAL Co., Ltd., PE-3A, trifunctional)

Pentaerythritol tetraacrylate (manufactured by KYOEISHA CHEMICAL Co., Ltd., PE-4A, tetrafunctional)

Dipentaerythritol hexaacrylate (manufactured by KYOEISHA CHEMICAL Co., Ltd., PE-6A, hexafunctional)

Bisphenol A skeleton acrylate (manufactured by Shin Nakamura Chemical Co., Ltd., EA1020)

Ethoxylated isocyanuric acid triacrylate (manufactured by Shin Nakamura Chemical Co., Ltd., A-9300)

Epoxy Resin

Triphenolmethane skeleton-containing polyfunctional solid epoxy (manufactured by Japan Epoxy Resin Co., Ltd., EP1032H60)

Bisphenol F liquid epoxy (manufactured by Japan Epoxy Resin Co., Ltd., YL983U)

(b) Curing Agent

Dicumyl peroxide (manufactured by NOF Corporation, PERCUMYL D)

Di-tert-butyl peroxide (manufactured by NOF Corporation, PERBUTYL D)

2,4-diamino-6-[2'-methylimidazolyl-(1')]-ethyl-s-triazine isocyanuric acid adduct (manufactured by SHIKOKU CHEMICALS CORPORATION, 2MAOK-PW)

(c) Polymer Component

Phenoxy resin (manufactured by Tohto Kasei Co., Ltd., ZX1356, Tg: approximately 71° C., Mw: approximately 63000)

(d) Filler

Silica filler (manufactured by Admatechs Company Limited, SE2050, average particle diameter: 0.5 μm)

Epoxysilane surface-treated filler (manufactured by Admatechs Company Limited, SE2050SEJ, average particle diameter: 0.5 μm)

Methacryl surface-treated nano silica filler (manufactured by Admatechs Company Limited, YA050C-SM, represented as "SM nano silica" hereinafter, average particle diameter: approximately 50 nm)

Organic filler (resin filler, manufactured by ROHM AND HAAS JAPAN K. K., EXL-2655: core-shell type organic fine particle)

(e) Fluxing Agent (Carboxylic Acid)

2-methyl glutaric acid (manufactured by Aldrich, Inc., melting point: approximately 77° C., represented as "glutaric acid" hereinafter)

Example 1

A (meth)acrylic compound, an inorganic filler (SE2050, SE2050SEJ, SM nano silica), and an organic filler of blending amounts (unit: parts by mass) shown in Tables 1 and 2 were added to an organic solvent (methyl ethyl ketone) so that NV60% was set. Then, beads having a diameter of 1.0 mm and beads having a diameter of 2.0 mm were added in an amount equal to the weight of solid content, and stirring was performed with a bead mill (manufactured by Fritsch Japan Co., Ltd., planetary pulverizing mill P-7) for 30 minutes. Subsequently, a phenoxy resin (ZX1356) was added, and stirring was performed again with a bead mill for 30 minutes. After stirring, a curing agent was added, followed by stirring, and the beads were then removed by filtration. The varnish thus produced was applied with a compact precision coating apparatus (manufactured by YASUI SEIKI CO., Ltd.), and drying was performed in a clean oven (manufactured by ESPEC Corp.) (70° C./10 min) to obtain a film adhesive.

Examples 2 to 7 and Comparative Examples 1 to 6

Film adhesives were obtained in the same manner as in Example 1 except that materials to be used were changed as shown in the following Tables 1 and 2. An epoxy resin was added together with a (meth)acrylic compound, and a fluxing agent was added together with a (meth)acrylic compound.

<Method for Measuring Curing Reaction Rate>

After 10 mg of a sample (film adhesive) was put into an aluminum pan, measurement was performed at a temperature raising rate of 20° C./min in a temperature range of 30 to 300° C. using DSC (manufactured by PerkinElmer, Inc., trade name: DSC-7 type). When an untreated sample was measured, ΔH (J/g) was defined as "ΔH1"; when a sample heat-treated at 200° C. for 5 seconds on a hot plate was measured, ΔH (J/g) was defined as "ΔH2"; and a curing reaction rate was calculated according to the following formula. The curing reaction rate of 90% or more was represented as "A"; the curing reaction rate of 80% or more and less than 90% was represented as "B"; and the curing reaction rate of less than 80% was represented as "C". The results are shown in Tables 1 and 2.

(ΔH1−ΔH2)/ΔH1×100=curing reaction rate (%)

<Evaluations>

(Evaluation of Voids)

Figure 4:
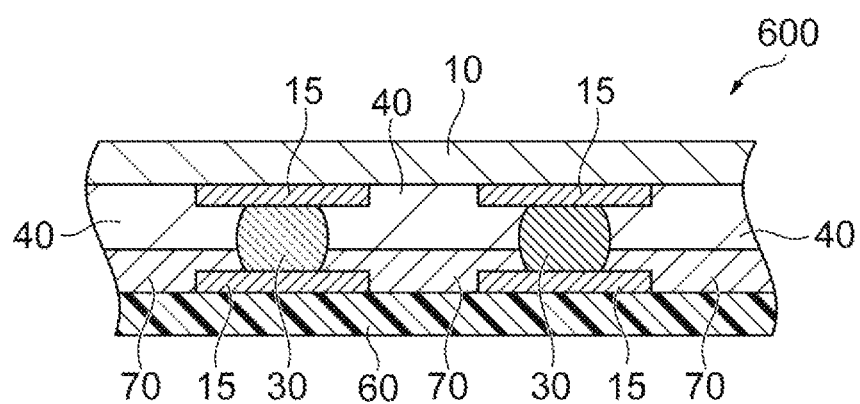
FIG. 4 is a schematic sectional view showing a semiconductor device of another embodiment of the present invention.

The produced film adhesive was cut (8 mm×8 mm×0.045 mm$^t$), and was applied to a glass epoxy substrate (glass epoxy base material: 420 μm in thickness, copper wire: 9 μm in thickness); a semiconductor chip with solder bumps (chip size: 7.3 mm×7.3 mm×0.15 mm$^t$, bump height (total of a copper pillar+solder): approximately 45 μm, the number of bumps: 328, pitch: 80 μm, distance between Cu wires: 40 μm (space)) was mounted with FCB3 (manufactured by Panasonic Corporation) (mounting condition: temperature of press bonding head: 130° C./2 seconds+200° C./5 seconds+240° C./3 seconds, 75 N), thereby obtaining a semiconductor device A as in FIG. 4. A stage temperature was set to 80° C.

The produced film adhesive was cut (8 mm×8 mm×0.045 mm$^t$), and was applied to a glass epoxy substrate (glass epoxy base material: 420 μm in thickness, copper wire: 9 μm in thickness); a semiconductor chip with solder bumps (chip size: 7.3 mm×7.3 mm×0.15 mm$^t$, bump height (total of a copper pillar+solder): approximately 45 μm, the number of bumps: 328, pitch: 80 μm, distance between Cu wires: 40 μm (space)) was mounted with FCB3 (manufactured by Panasonic Corporation) (mounting condition: temperature of press bonding head: (1) 130° C./1 second+200° C./2 seconds+250° C./2 seconds, (2) 130° C./2 seconds+200° C./5 seconds+250° C./3 seconds, (3) 130° C./2 seconds+200° C./5 seconds+250° C./5 seconds, 75 N in all), thereby obtaining a semiconductor device B as in FIG. 4. A stage temperature was set to 80° C.

An image of the appearance of the obtained semiconductor device was taken with an ultrasonic image diagnostic apparatus (Insight-300 manufactured by Insight K.K), and an image of a semiconductor adhesive layer on a semiconductor chip was taken in with a scanner GT-9300UF (manufactured by Seiko Epson Corporation). Subsequently, color tone correction and black and white conversion were performed with an image processing software Adobe Photoshop (registered trademark) to distinguish void portions, and the proportion of the void portions was calculated based on a histogram. The area of the semiconductor adhesive portion on the semiconductor chip was 100%. A case where an occupied area of voids was 5% or less was ranked as "A"; a case where an occupied area of voids was more than 5% and 10% or less was ranked as "B"; and a case where an occupied area of voids was more than 10% was ranked as "C". "A" and "B" were determined to be good, and "C" was determined to be poor. The results of the semiconductor device A are shown in Table 1. The results of the semiconductor device B are shown in Table 2.

(Evaluation of Connection Reliability (Evaluation of Solder Scattering and Flowage))

The obtained semiconductor device was polished, and the section of a connection portion was then observed using a metallograph (manufactured by OLYMPUS Corporation, BX60). A case where solder crept up by 30% or more of the height of a Cu bump on the side surface of the Cu bump was ranked as "B" (poor), and a case where solder crept up by less than 30% of the height of the Cu bump was ranked as "A" (good). The results of the semiconductor device A are shown in Table 1. The results of the semiconductor device B are shown in Table 2.

(Evaluation of Insulation Reliability (HAST Test: Highly Accelerated Storage Test))

The obtained semiconductor device was placed in an accelerated life test apparatus (manufactured by HIRAYAMA MANUFACTURING CORPORATION, trade name: PL-422R8, condition: 130° C./85% RH/100 hours, 5 V applied) to obtain a sample for evaluating insulation reliability. Next, the sample was polished, and an image of the section of a connection portion was then taken in using a metallograph (manufactured by OLYMPUS Corporation, BX60), and ranked. Color tone correction and black and white conversion were performed with an image processing software Adobe Photoshop to distinguish corrosion portions, and the proportion of the corrosion portions was calculated based on a histogram. The semiconductor bonded part between two bumps of the connection portion was 100%, and the discoloration portion in the range was calculated by the same method as the above. A case where the occupancy (corrosion generating rate) of the corrosion portion was 20% or less was ranked as "A" (good, corrosion suppression), and a case where the occupancy was more than 20% was ranked as "B" (poor). The results of the semiconductor device A are shown in Table 1. The results of the semiconductor device B are shown in Table 2.

TABLE 1

| | | | Examples | | | | | | | Comparative Examples | | | | | |
|---|---|---|---|---|---|---|---|---|---|---|---|---|---|---|---|
| | Raw material | | 1 | 2 | 3 | 4 | 5 | 6 | 7 | 1 | 2 | 3 | 4 | 5 | 6 |
| (Meth)acrylic compound | | PE-3A | 60 | — | — | — | — | — | — | — | — | 30 | — | — | — |
| | | PE-4A | — | 60 | — | — | — | — | — | — | — | — | 30 | — | — |
| | | PE-6A | — | — | 60 | — | — | — | — | — | — | — | — | 30 | — |
| | | EA1020 | — | — | — | 60 | — | — | — | — | — | — | — | — | — |
| | | A-9300 | — | — | — | — | 60 | 60 | 60 | — | — | — | — | — | 30 |
| Epoxy resin | | EP1032H60 | — | — | — | — | — | — | — | 45 | 60 | 22.5 | 22.5 | 22.5 | 22.5 |
| | | YL983U | — | — | — | — | — | — | — | 15 | 35 | 7.5 | 7.5 | 7.5 | 7.5 |
| Curing agent | | PERCUMYL D | 2 | 2 | 2 | 2 | 2 | 2 | — | — | — | 1 | 1 | 1 | 1 |
| | | PERBUTYL D | — | — | — | — | — | — | 2 | — | — | — | — | — | — |
| | | 2MAOK-PW | — | — | — | — | — | — | — | 6 | 9 | 3 | 3 | 3 | 3 |
| Polymer component | Phenoxy resin | ZX1356 | 30 | 30 | 30 | 30 | 30 | 30 | 30 | 30 | 30 | 30 | 30 | 30 | 30 |
| Filler | Inorganic filler | SE2050 | 15 | 15 | 15 | 15 | 15 | 15 | 15 | 15 | 15 | 15 | 15 | 15 | 15 |
| | | SE2050SEJ | 15 | 15 | 15 | 15 | 15 | 15 | 15 | 15 | 15 | 15 | 15 | 15 | 15 |
| | | SM nano silica | 45 | 45 | 45 | 45 | 45 | 45 | 45 | 45 | 45 | 45 | 45 | 45 | 45 |
| | Organic filler | EXL-2655 | 10 | 10 | 10 | 10 | 10 | 10 | 10 | 10 | 10 | 10 | 10 | 10 | 10 |
| Fluxing agent | | Glutaric acid | — | — | — | — | — | 4 | — | 4 | 4 | 4 | 4 | 4 | 4 |
| Results of evaluation | | Curing reaction rate | A | B | B | A | A | A | A | C | C | C | C | C | C |
| | | Evaluation of voids | B | B | B | A | A | A | A | C | C | B | B | B | B |
| | | Evaluation of connection reliability | A | A | A | A | A | A | A | B | B | B | B | B | B |
| | | Evaluation of insulation reliability (evaluation of corrosion) | A | A | A | A | A | A | A | B | B | B | B | B | B |

TABLE 2

| | | | Examples | | | | | | | Comparative Examples | | | | | |
|---|---|---|---|---|---|---|---|---|---|---|---|---|---|---|---|
| | Raw material | | 1 | 2 | 3 | 4 | 5 | 6 | 7 | 1 | 2 | 3 | 4 | 5 | 6 |
| (Meth)acrylic compound | | PE-3A | 60 | — | — | — | — | — | — | — | — | 30 | — | — | — |
| | | PE-4A | — | 60 | — | — | — | — | — | — | — | — | 30 | — | — |
| | | PE-6A | — | — | 60 | — | — | — | — | — | — | — | — | 30 | — |
| | | EA1020 | — | — | — | 60 | — | — | — | — | — | — | — | — | — |
| | | A-9300 | — | — | — | — | 60 | 60 | 60 | — | — | — | — | — | 30 |
| Epoxy resin | | EP1032H60 | — | — | — | — | — | — | — | 45 | 60 | 22.5 | 22.5 | 22.5 | 22.5 |
| | | YL983U | — | — | — | — | — | — | — | 15 | 35 | 7.5 | 7.5 | 7.5 | 7.5 |
| Curing agent | | PERCUMYL D | 2 | 2 | 2 | 2 | 2 | 2 | — | — | — | 1 | 1 | 1 | 1 |
| | | PERBUTYL D | — | — | — | — | — | — | 2 | — | — | — | — | — | — |
| | | 2MAOK-PW | — | — | — | — | — | — | — | 6 | 9 | 3 | 3 | 3 | 3 |
| Polymer component | Phenoxy resin | ZX1356 | 30 | 30 | 30 | 30 | 30 | 30 | 30 | 30 | 30 | 30 | 30 | 30 | 30 |
| Filler | Inorganic filler | SE2050 | 15 | 15 | 15 | 15 | 15 | 15 | 15 | 15 | 15 | 15 | 15 | 15 | 15 |
| | | SE2050SEJ | 15 | 15 | 15 | 15 | 15 | 15 | 15 | 15 | 15 | 15 | 15 | 15 | 15 |
| | | SM nano silica | 45 | 45 | 45 | 45 | 45 | 45 | 45 | 45 | 45 | 45 | 45 | 45 | 45 |
| | Organic filler | EXL-2655 | 10 | 10 | 10 | 10 | 10 | 10 | 10 | 10 | 10 | 10 | 10 | 10 | 10 |

TABLE 2-continued

| | Raw material | | Examples 1 | 2 | 3 | 4 | 5 | 6 | 7 | Comparative Examples 1 | 2 | 3 | 4 | 5 | 6 |
|---|---|---|---|---|---|---|---|---|---|---|---|---|---|---|---|
| Fluxing agent | Glutaric acid | | — | — | — | — | — | 4 | — | 4 | 4 | 4 | 4 | 4 | 4 |
| | Curing reaction rate | | A | B | B | A | A | A | A | C | C | C | C | C | C |
| Results of evaluation | 130° C./1 second + | Evaluation of voids | B | B | B | A | A | A | A | C | C | C | C | C | C |
| | 200° C./2 seconds + 250° C./2 seconds | Evaluation of connection reliability | A | A | A | A | A | A | A | B | B | B | B | B | B |
| | | Evaluation of insulation reliability (evaluation of corrosion) | A | A | A | A | A | A | A | B | B | B | B | B | B |
| | 130° C./2 seconds + | Evaluation of voids | B | B | B | A | A | A | A | C | C | B | B | B | B |
| | 200° C./5 seconds + 250° C./3 seconds | Evaluation of connection reliability | A | A | A | A | A | A | A | B | B | B | B | B | B |
| | | Evaluation of insulation reliability (evaluation of corrosion) | A | A | A | A | A | A | A | B | B | B | B | B | B |
| | 130° C./2 seconds + | Evaluation of voids | B | B | B | A | A | A | A | B | B | B | B | B | B |
| | 200° C./5 seconds + 250° C./5 seconds | Evaluation of connection reliability | A | A | A | A | A | A | A | B | B | B | B | B | B |
| | | Evaluation of insulation reliability (evaluation of corrosion) | A | A | A | A | A | A | A | B | B | B | B | B | B |

In Examples, when the semiconductor adhesive was kept at 200° C. for 5 seconds, the curing reaction rate thereof was 80% or more, and the evaluation results of voids, connection reliability, and insulation reliability were good. On the other hand, in Comparative Examples, good connection reliability and insulation reliability were not obtained.

REFERENCE SIGNS LIST

10: semiconductor chip, 15: wire, 20, 60: substrate, 30: connection bump, 32: bump, 34: penetrating electrode, 40: semiconductor adhesive, 50: interposer, 70: solder resist, 100, 200, 300, 400, 500, 600: semiconductor device.

The invention claimed is:

1. A semiconductor adhesive used for sealing connection portions of a semiconductor device, wherein:
    in the semiconductor device, the connection portion of a semiconductor chip and the connection portion of a wiring circuit substrate are electrically connected to each other or the connection portions of a plurality of semiconductor chips are electrically connected to each other;
    the semiconductor adhesive comprises a (meth)acrylic monomer that is a solid at 25° C. and a curing agent; and
    when the semiconductor adhesive is kept at 200° C. for 5 seconds, a curing reaction rate thereof is 80% or more.

2. The semiconductor adhesive according to claim 1, wherein the semiconductor adhesive is in a film form.

3. The semiconductor adhesive according to claim 1, wherein the curing agent is a thermal radical generator.

4. The semiconductor adhesive according to claim 1, wherein the curing agent is a peroxide.

5. The semiconductor adhesive according to claim 1, wherein the semiconductor adhesive further comprises a polymer component having a weight average molecular weight of 30000 or more.

6. The semiconductor adhesive according to claim 1, wherein the semiconductor adhesive further comprises a polymer component having a weight average molecular weight of 10000 or more.

7. The semiconductor adhesive according to claim 6, wherein a weight average molecular weight of the polymer component is 30000 or more, and a glass transition temperature of the polymer component is 100° C. or lower.

8. A method for manufacturing a semiconductor device, comprising:
    step of connecting a semiconductor chip and a wiring circuit substrate to each other through a semiconductor adhesive and electrically connecting a connection portion of the semiconductor chip and a connection portion of the wiring circuit substrate to each other to obtain a semiconductor device, or the step of connecting a plurality of semiconductor chips to each other through a semiconductor adhesive and electrically connecting connection portions of the plurality of semiconductor chips to each other to obtain a semiconductor device;
    wherein the semiconductor adhesive is the semiconductor adhesive according to claim 1.

9. The method for manufacturing a semiconductor device according to claim 8, wherein the semiconductor adhesive is in a film form.

10. The method for manufacturing a semiconductor device according to claim 8, wherein the connection portions are connected to each other by metal joining.

11. The method for manufacturing a semiconductor device according to claim 8, wherein the curing agent is a thermal radical generator.

12. The method for manufacturing a semiconductor device according to claim 8, wherein the curing agent is a peroxide.

13. A semiconductor device obtained by the manufacturing method according to claim 8.

14. The method for manufacturing a semiconductor device according to claim 8, wherein the semiconductor adhesive further comprises a polymer component having a weight average molecular weight of 30000 or more.

15. The method for manufacturing a semiconductor device according to claim 8, wherein the semiconductor adhesive further comprises a polymer component having a weight average molecular weight of 10000 or more.

16. The method for manufacturing a semiconductor device according to claim 15, wherein a weight average molecular weight of the polymer component is 30000 or more, and a glass transition temperature of the polymer component is 100° C. or lower.

17. A semiconductor adhesive used for sealing connection portions of a semiconductor device, wherein:
in the semiconductor device, the connection portion of a semiconductor chip and the connection portion of a wiring circuit substrate are electrically connected to each other or the connection portions of a plurality of semiconductor chips are electrically connected to each other;
the semiconductor adhesive comprises a (meth)acrylic monomer and a curing agent; wherein the curing agent is a peroxide; and
wherein, when the semiconductor adhesive is kept at 200° C. for 5 seconds, a curing reaction rate thereof is 80% or more.

18. The semiconductor adhesive according to claim 17, wherein the semiconductor adhesive further comprises a polymer component having a weight average molecular weight of 30000 or more.

19. A method for manufacturing a semiconductor device, comprising:
connecting a semiconductor chip and a wiring circuit substrate to each other through a semiconductor adhesive and electrically connecting a connection portion of the semiconductor chip and a connection portion of the wiring circuit substrate to each other to obtain a semiconductor device, or the step of connecting a plurality of semiconductor chips to each other through a semiconductor adhesive and electrically connecting connection portions of the plurality of semiconductor chips to each other to obtain a semiconductor device;
wherein the semiconductor adhesive is the semiconductor adhesive according to claim 17.

20. The method for manufacturing a semiconductor device according to claim 19, wherein the semiconductor adhesive further comprises a polymer component having a weight average molecular weight of 30000 or more.

* * * * *